United States Patent [19]

Beauchesne et al.

[11] Patent Number: 4,481,627
[45] Date of Patent: Nov. 6, 1984

[54] EMBEDDED MEMORY TESTING METHOD AND APPARATUS

[75] Inventors: Robert C. Beauchesne, Brockton; Robert J. Russell, Boston, both of Mass.

[73] Assignee: Honeywell Information Systems Inc., Waltham, Mass.

[21] Appl. No.: 316,720

[22] Filed: Oct. 30, 1981

[51] Int. Cl.³ .......................................... G01R 31/28
[52] U.S. Cl. .................................. 371/21; 324/73 R; 371/20; 371/25
[58] Field of Search ..................... 371/21, 25, 15, 20; 324/73 R, 73 AT

[56] References Cited

U.S. PATENT DOCUMENTS

| | | | |
|---|---|---|---|
| 3,961,251 | 6/1976 | Hurley et al. | 324/73 AT |
| 3,961,252 | 6/1976 | Eichelberger | 324/73 AT |
| 3,961,254 | 6/1976 | Cavaliere et al. | 324/73 AT |
| 4,298,980 | 11/1981 | Hajdu et al. | 371/25 |
| 4,317,200 | 2/1982 | Wakatsuki et al. | 371/25 |
| 4,326,266 | 4/1982 | Davis et al. | 371/21 |

OTHER PUBLICATIONS

Bohner et al., Module-in-Place Testing Isolation Technique Using Shift Registers, IBM Tech. Discl. Bulletin, vol. 23, No. 9, Feb. 1981, pp. 4080–4082.
Jackson et al., Module-in-Place Testing Autoguided Probe Isolation and Diagnostic Technique, vol. 23, No. 9, Feb. 1981, IBM Tech. Discl. Bulletin, pp. 4078–4079.
Funatsu et al., Designing Digital Circuits With Easily Testable Consideration, 1978 Semiconductor Test Conference, IEEE, Cherry Hill, N.J., Oct.–Nov. 1978, pp. 98–102.

Primary Examiner—Charles E. Atkinson
Attorney, Agent, or Firm—William A. Linnell; Nicholas Prasinos

[57] ABSTRACT

A method for testing memory arrays embedded within electronic assemblies having other combinatorial logic elements connected to the inputs thereof. By following stated design rules, the embedded memory can be isolated from the combinatorial logic element and tested by use of a memory test subsystem either before or after the combinatorial logic elements are tested by a logic test subsystem. Both logic and memory tests are performed by a process that requires but a single handling of the electronic assemblies.

5 Claims, 2 Drawing Figures

EMBEDDED MEMORY TESTING METHOD AND APPARATUS

RELATED APPLICATIONS

The following patent applications, which are assigned to the same assignee as the instant application, have related subject matter and are incorporated herein by reference. Certain portions of the system and processes herein disclosed are not our invention, but are the invention of the below-named inventors as defined by the claims in the following patent applications:

| TITLE | INVENTORS | SERIAL NUMBER |
|---|---|---|
| Reciprocal Quiescence Design Method and Apparatus | Robert J. Russell | 316,691 |
| Compatible Reciprocal Quiescence Design Apparatus and Method | Robert J. Russell | 315,594 |

BACKGROUND OF THE INVENTION

1. Field of the Invention

This invention relates to a method of designing and testing electronic assemblies; and more specifically a method of designing electronic assemblies, having both logic and memory, and a method of testing such embedded memory and logic, using a combined logic and memory tester.

2. Description of the Prior Art

Current methods for testing electronic equipment include various methods which individually test each printed circuit board used in the assembled equipment.

Board level automatic test equipment (ATE) intended for general purpose application utilizes either of (or a combination of) two approaches: in-circuit test (ICT) or functional board test (FBT). ICT is an attempt to test individual components of an assembly one-by-one, by providing stimulus directly to the device singled out for test. Instead of using a card-edge connector, an in-circuit test is usually administered by mounting the printed circuit board in a multiple-pin (bed-of-nails) fixture. The fixture pins, which are usually brought into contact with test points (nodes) on the board by vacuum actuation, are configured so as to contact every node on the circuit board. A different test fixture is fabricated for each circuit board type being tested so that the pins line up with the nodes.

Providing test stimulus for digital devices requires overdriving the outputs of devices of the assembly that control the target device (i.e., component to be tested) during functional operation of the unit. While the possibility of damaging these other devices, by forcing them to an opposite state, has been empirically shown to be of little current practical significance, this problem will continue to exist, and may even become insurmountable at some point in the evolution of integrated circuits. In many cases, the overdrive capability of the tester is inadequate to deal with particular devices, requiring that the forcing be accomplished at a previous level of logic (i.e., earlier in the circuit paths). Such fixes interfere with diagnostic accuracy, typically being beyond the scope of the tester software (i.e., the program that controls the execution of the ATE tester sequence) to fully, or even largely, integrate. The advent of Advanced Schottky devices, such as the Texas Instruments Incorporated "AS Series", produce an even greater demand on tester hardware and software.

Driver current cannot be increased at the expense of slew rate (i.e., rate of change of voltage), however, since device operation is often dependent on some minimum risetime. More current switching in a shorter time produces increased noise to further complicate tester design goals. The inability to prevent spikes when overdriven circuits attempt to change states, as an indirect result of stimulus to the target device, often requires that other devices be preconditioned to prevent such feedback. Since the algorithms to accomplish this guarding (i.e., precondition to prevent feedback) must deal with device functionality, the tester software must increase in capability at a rate coupled with the change of device complexity. As fewer small scale integrated (SSI) circuits or medium scale integrated (MSI) circuits devices are used, not only will tester software have to be exceedingly complex to identify these feedback loops, but it will often be unable to find a point at which to inject the guarding stimulus.

The drivers to provide the needed stimulus over a variety of integrated circuit logic families are necessarily expensive. Individual driver cost is a major issue where the need for more than a thousand drivers per tester is not uncommon.

ICT stimulus problems notwithstanding, there is no guarantee that the inability of the target device to produce a correct level is caused by an internal fault. Wired-or's, marginal shorts, or loading by other devices are possibilities which require further analysis merely to be discounted. While the problems of developing techniques to deal with these situations do not seem beyond solution, the cure is already far behind the need. Furthermore, the use of devices having connections accessible only on the side of the printed circuit board contacting the bed-of-nails, will likely tax a solution applicable to devices packaged in dual-in-line-packages (DIP's).

In-circuit testing, then, must deal with a variety of problems not fully appreciable when the possible ability to test a single device at a time seems the central issue. The ICT problems may be summarized as follows:

(1) Overdriving requirements.
(2) Possible device damage.
(3) Necessity to guard.
(4) Bed-of-nail contact.
(5) Reliance on etch.
(6) Intra-node diagnosis.
(7) Driver cost.

The functional board test approach is an attempt to provide stimulus and check responses at the external connections of an assembly, usually at the board's edge connections, in much the same fashion as the unit would function in a system environment. To predict the state of external connections, for error detection; and internal points, for fault diagnosis, requires extensive tester software. While the alternative of eliminating this software and learning the responses has been used in some FBT efforts, the disadvantages of doing so outweigh the cost advantage immediately gained in most cases.

If it were true that an assembly, correctly designed from a utilization standpoint, would always respond in the same manner to given stimulus, the only problems to be reckoned with using this approach would involve timing repeatability from one test to another or from one tester to another. However, it is generally incumbent upon the hardware designer only that all such assemblies respond to user stimulus in the same user-visible manner. This requires that a complex board to be tested with an FBT tester be designed for repeatability rather than merely for functionality.

The degree of repeatability necessary depends upon the resolution of the tester. Currently, tester vendors tout nanosecond capabilities, but these figures apply only to hardware control which is not fully integrated into the tester software. This degree of precision, however, would have to be supported by something even more complex than the present stored-pattern concept. Even without such resolution, differences found between a sample board and simulator generated patterns may require manual masking of the response to be checked for at a particular point. Such masking obviously degrades the diagnostic process, adding to the number of cases where a problem may be detected but escapes diagnosis, while often involving repeated lengthy attempts at isolation.

The quality of an FBT program to efficiently resolve faults correctly—as opposed to getting lost or requiring scores of probes on even a small board—is difficult to determine. While it would seem likely that the probing algorithm could be applied as an option in faults simulation, such a feature has not been noted in FBT primary vendor literature, if indeed it exists at all. However, considering that it may take several months to generate FBT patterns with sufficient comprehensiveness of detection, and that solving the diagnostic problem could greatly extend the time, it is not necessarily in the best interest of the tester vendor to provide even more hurdles for the tester programmer. Meanwhile, however, higher levels of integration make mass part changes less acceptable when the test system fails.

Long tester program development times cannot be said to be reduced by automatic test vector generators, as they are characteristically ineffective on complex boards. A simple logic change may produce nearly catastrophic results on a test program even during this long manual development stage. The reliance upon product stability means that FBT cannot be depended upon as a predictable fault elimination mechanism throughout a typical product life cycle.

Currently, users are satisfied with comprehensiveness figures measured in terms of "stuck-at" faults (i.e., a fault that causes a point to remain at logic 0 or 1 throughout the test sequence). Exact definitions vary from vendor to vendor. Dynamic faults simulation is desirable, of course, but the tester software problems are probably insurmountable. As it is, one major vendor estimated the time for faults simulation of a 7000 gate equivalent device exercised by 4000 vectors to consume sixteen hours of CPU time. While those involved with memory testing stress pattern sensitivity checks, and while logic becomes more and more dense, the stuck-at evaluations become less and less meaningful.

While a number of hardware additions have been made to offset tester software inadequacies, especially in dealing with analog circuits, it is often found that features cannot be used together. For example, fault diagnosis involving current tracing to determine whether the error is attributable to a defect in the source driver or one of its loads may not be available for use when the tester is applying patterns at fast rates.

Major unresolved problem areas in the FBT approach are:

(1) Repeatability not easily attainable.
(2) Long development time.
(3) Over-reliance on design for testability.
(4) Diagnostic quality indeterminate.
(5) Sensitivity to design changes.
(6) Mutually exclusive features.

Until recently, when electronic systems, such as computers which contained memories comprised of a plurality of integrated circuit chips were built, the memory was usually partitioned into one electronic assembly such as a printed circuit board and the other combinatorial logic within the system was usually packaged in other electronic assemblies separate from the memory. During the manufacturing of these partitioned systems, the electronic assembly containing in the memory could be tested by using a memory tester which in most cases would connect to an edge connector on the memory's printed circuit board and exercise the memory and evaluate the test the results. The other electronic assemblies, which contain the combinatorial logic, would be tested by a separate in-circuit tester which would usually make contact with the electronic assembly by using a bed-of-nails fixture. Alternatively, the electronic assembly could be tested using a functional board tester which would be connected to the edge connectors of the electronic assembly. Until now this approach has worked fairly well allowing the memory to be thoroughly tested by the memory tester and the other logic to be thoroughly tested by a logic tester, each tester being able to be specialized such that the tests that are most important for the elements it is testing can be conducted with an acceptable degree of precision and thoroughness.

More recently, with the advent of higher density circuits, more complex products, and larger printed circuit boards, the trend in the industry is to have an increasing number of electronic assemblies (printed circuit boards) which contain memory arrays embedded within the boards which also contain combinatorial logic. Many electronic assemblies, such as found in CRT terminals used in computer systems, now contain a fairly substantial amount of MOS or bipolar read-only memory (ROM) and random access memory (RAM) packed in integrated circuit chips mounted on the printed circuit boards. These ROMS and RAMS should be tested to the same extent memories used in main memory boards are tested. Typically, memory boards require testing on a memory test system which permits parametric test to be conducted such that parameters may be modified to insure that a large percentage of "soft" errors can be detected. These "soft" errors do not occur consistently, but are errors which occur when the memory is operating under marginal conditions. This embedding of the memory arrays within the electronic assemblies has presented a problem as to how to test the board during manufacture or repair because of the difficulty in setting up the necessary inputs to the memory array and in measuring the outputs. Attempting to perform memory tests using standard in-circuit test philosophies have generally resulted in the abandonment of a parametric test for the memory and to be satisfied with simply a gross test of the memory. Unfortunately, experience with memory array integrated circuits, the natures of the circuits themselves, and the opinions of experts in the field of memory arrays indicate that the abandoning of the parametric tests with respect to memory arrays is not wise and can be expected to lead to system failures in the field as the memory arrays which are marginal fail.

Currently the testing of logic elements for pattern sensitivity and AC parameters is not considered as vital as it is for memory arrays in the vast majority of cases. In general, the testing of the logic elements in an electronic assembly for their static functionality by use of ICT techniques is considered largely adequate with the number of problems that will go undetected from not having more fully tested the logic elements being considered not a major consequence. However, in the case of integrated circuit memory arrays, it is generally felt that the memories must be tested dynamically at speed in order to adequately test the memory. Therefore, one of the main distinctions between a memory test system, which may be considered to be a specialized FBT system, and an in-circuit logic tester is the fact that, in general, logic testers do not function at the same speeds required of a memory test system. Although, if possible, the testing of logic elements at dynamic speeds is desirable, it is felt to be very critical in the case of memory arrays because they are susceptible to pattern sensitivity problems that may occur only when operated under dynamic conditions.

Other distinctions that exist between memory test systems and logic test systems are that memory test systems are relatively straightforward to change when switching from the testing of one device to another device. These changes being generally in the area of pattern selection so that a pattern is applied to the memory device that will detect problems associated with those for which the particular memory device may be susceptible. Changes are also in the area of the number of address, and data input, and data output bits that are associated with a particular memory array. Logic testers, on the other hand, have test programs which are generally more complex than those associated with memory arrays because the logic elements are not repeated as they are in memory arrays and therefore most logic test programs are more customized programs. A further distinction is that most memory testers attach to the electronic assembly under test (i.e., the memory) through use of edge connectors (the number of connections normally being in the hundreds), whereas most in-circuit logic testers use a bed-of-nails fixture to contact a very large number (into the thousands) of points on the electronic assembly.

An article entitled, "In-Circuit Testing Comes of Age" by Douglas W. Raymond, which compares in-circuit testing (ICT) with functional board testing (FBT) can be found in the August 1981 issue of *Computer Design* on pages 117-124, and is incorporated herein by reference.

Therefore, what is needed is an effective and efficient way to test integrated circuit arrays which are embedded within larger electronic assemblies.

OBJECTS OF THE INVENTION

Accordingly, it is an object of the present invention to provide a method and apparatus by which memory arrays embedded in electronic assemblies with other combinatorial logic can be tested to nearly the same precision as separately implemented or non-embedded memory arrays.

It is a further object of the present invention to provide a method and apparatus by which memory arrays mounted in electronic assemblies with other combinatorial logic can be tested with minimal analysis of how the memory arrays are connected with other elements or their functions within the electronic assembly.

It is a still further object of the present invention to provide a method and apparatus by which memory arrays mounted on an electronic assembly with other combinatorial logic can be tested with a minimal number of points in contact with the electronic assembly.

It is a still further object of the present invention to provide a low cost and simple method and apparatus by which electronic assemblies containing both combinatorial logic and memory arrays can be tested late in the production cycle.

It is a still further object of the present invention to provide a method and apparatus by which a test of the memory arrays can be developed mainly by use of existing memory test programs.

This invention is pointed out with particularity in the appended claims. An understanding of the above and further objects and advantages of this invention can be obtained by referring to the following description taken in conjunction with the drawings.

SUMMARY OF THE INVENTION

The foregoing objects are achieved by providing a method containing design rules for use when designing an electronic assembly with embedded memory required such that all inputs to the embedded memory come from logical elements the output stages of which can be placed in a high-impedance state by the test system during the time that the memory is tested. These design rules also require that a means be provided for inhibiting the parallel operation of any other logic element or memory whose outputs are wire-ored with those of the memory to be tested. Electronic assemblies designed following these rules can be tested using a combined test system comprised of a memory test subsystem and a logic test subsystem. The combined test system is then programmed such that the logic test subsystem is used to force the output stages of logic elements that provide input signals to the memory to a high-impedance state and inhibit the parallel operation of any logic elements, including other memories, that have outputs that are wire-ored with the outputs of the memory to be tested. Once these conditions are established, the logic test subsystem signals the memory test subsystem that the memory can be tested in relative isolation from the other combinatorial logic in the electronic assembly. After the memory test is completed, the memory test subsystem signals the logic test subsystem which can then perform of any remaining tests of the logic elements that need to be done, or it can set up the initial conditions required to test other memories embedded in the electronic assembly and then signal the memory test subsystem to perform another memory test. This process is repeated until the electronic assembly is completely tested.

BRIEF DESCRIPTION OF THE DRAWINGS

The manner in which the method of the present invention is performed and the manner in which the apparatus of the present invention is constructed and its mode of operation can best be understood in light of the following detailed description together with the accompanying drawings in which like reference numbers identify like elements in the several figures and in which.

DESCRIPTION OF THE PREFERRED EMBODIMENT

Figure 1:
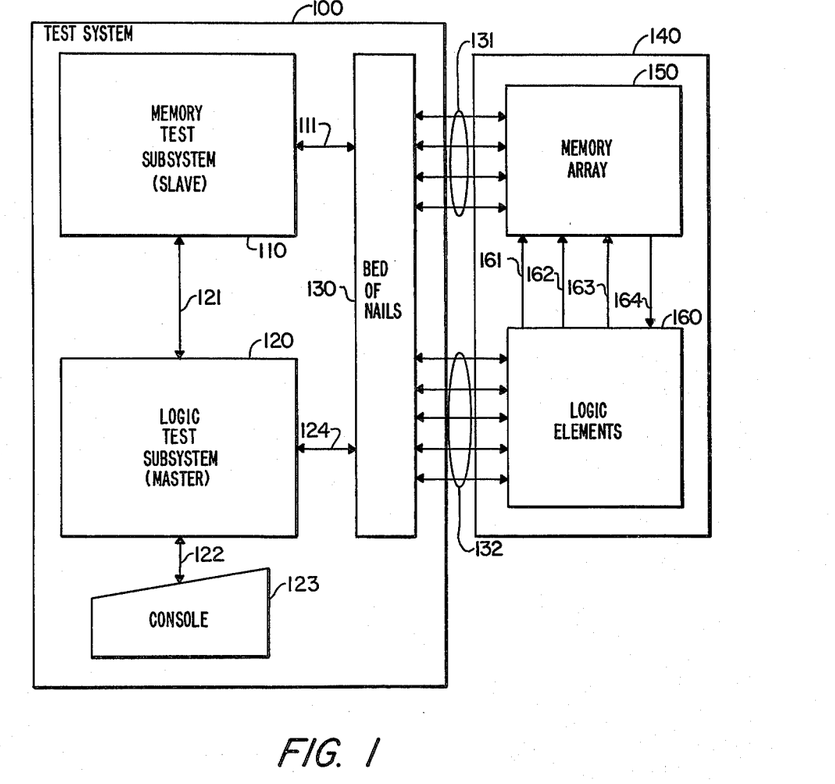
FIG. 1 is a block diagram of the combined testing system of the present invention.

In response to the need to be able to test electronic assemblies which contain embedded memory, the apparatus illustrated in FIG. 1 was developed. Referring to FIG. 1, it can be seen that test system 100 is comprised of a logic test subsystem 120 and a memory test subsystem 110 which when combined provide a test system which is capable of testing both the logic elements 160 and the memory array 150 embedded within the electronic assembly 140. As illustrated in FIG. 1, the contact interface between the electronic assembly 140 and the test system 100 is provided by a bed-of-nails fixture 130 which has multiple probes on it which make electrical contact with assorted nodes on the electronic assembly.

In order for test system 100 to function properly, the electronic assembly to be tested must be designed using the following rules:

1. All memory array input lines (e.g., control, address, and data) must be driven by devices which can be made to assume a high-impedance state at their output stage throughout the testing of the memory array.
2. Where the memory array outputs are wire-ored with other device outputs, a means must be provided for inhibiting the parallel operation of the other devices. The inhibiting of the parallel operation of other devices may be done by the tester overdriving a node or nodes, not necessarily for stimulating or measurement of the memory array to be tested.
3. Other established in-circuit testability design rules needed for compatibility with the logic test subsystem must also be followed.

Application of the first rule means that those electronic components (devices) the outputs of which are connected to provide inputs to the memory array must be constructed such that the output stage can assume a high-impedance state. Such devices, often referred to as tri-state devices, are available and are commonly used to provide inputs to bussed type logic circuits in which multiple components alternately feed inputs onto a common bus. The use of these tri-state devices, the outputs of which can assume either a logical 1, a logical 0, or a disabled (off) high-impedance state, are required so that by placing the output stages of the devices that normally drive the inputs into the memory array to the high-impedance state, the memory tester may precisely provide input stimulus to the memory array without having to overdrive these outputs from other components not being tested at the time the memory array is to be tested. Following of this rule eliminates the requirement to overdrive the memory array inputs and thereby allows a precise test to be conducted which is not considered currently feasible when overdriving is required. The method by which the output stages of the devices driving the input lines to the memory array is placed in the high-impedance state can be done by either providing a common control line to place all the devices in the high-impedance state or, if necessary, the overdriving of the state controls on the individual devices can be conducted by the logic test subsystem.

The requirement for high-impedance outputs eliminates the necessity to overdrive the input signals of the memory array (i.e., the target device) in order to counteract signals originating from the outputs of the combinatorial logic elements. This allows the memory array input signals to be precisely established by the tester. This high-impedance outputs requirement additionally prevents other components outputs from interferring with the memory arrays outputs when such outputs are connected in a wired-or (bussed) arrangement. Eliminating the overdrive requirement allows the memory test subsystems drivers/sensors to be designed for optimizing the precision of parametric measurements (such as output voltage and current, input voltage and current, timing relationships) and functional measurements (such as binary truth table at a specified clock rate) and minimizes the tradeoffs that are otherwise necessary when designing in-circuit ATE drivers/sensors which are able to overdrive signals originating from devices whose output stages are not in a high-impedance state.

The problem associated with having to overdrive the memory array input signals because the memory array is not isolated from the surrounding logic elements is that current tester technology does not allow the slew rate that is possible without having to overdrive. Therefore, the input stimulus cannot be provided at precise times which are generally used for memory testing at memory speeds. This precision is required to test memories at their normal operating speed, whereas this precision may not be required to test combinational logic for its static functionality. Therefore, elimination of the overdriving requirement allows the memory test subsystem to establish memory array input stimulus at precise times which is not practical when overdriving with in-circuit testers. In functional board testing, it is difficult, if not impractical or impossible, to provide input stimulus with precise timing if the memory array is buried among other logic elements at some distance from the board edge connector because of the within specification timing variations of the logic elements through which the input stimulus must go.

The high-impedance state is high relative to the nominal impedance of the memory test system driver used to stimulate the memory array during functional testing. In the case of some parametric testing, the output high impedance must be high relative to the combined impedance of the memory array and other elements to which it is functionally connected so as to allow measurement on the loading effect of those elements without consideration of the loading effect of the driving elements output.

As stated above, tri-state devices have been used in the past in circuits in which the outputs of multiple devices are combined onto a single bus. In bus designs, at any given instance in time, only one tri-state device is driving the bus and all other devices connected to the bus are in the high-impedance state and are not trying to drive the bus either to a logical 1 or a logical 0. The first rule requires that the tri-state devices be used not for their functional purpose within the circuit, but instead to insure testability of the memory array embedded within the electronic assembly. Therefore, in the present invention, tri-state devices are required not for their functional purpose within the electronic assembly (although functional use may also be present), but simply to insure the testability of the memory array, which is connected to the output of the tri-statable devices. By the use of tri-state devices to drive all of the inputs to the memory array, even if not required for functional use, the test system has the ability to turn off all of such devices and allow other input conditions to the memory array to be precisely established by the memory test subsystem. This allows the memory test subsystem to use the tri-stated lines which are connected to inputs of the memory arrays as test stimulation injection points to the memory array.

The second rule which requires that the outputs of the memory array which are wire-ored with the outputs of other devices have a means provided for inhibiting the parallel operation of the other devices such that the outputs of the memory array can be measured in relative isolation without interference from the outputs of other devices. This allows a precise test to be conducted of the memory array. Without this memory array output isolation, the measurements made at the outputs of the memory array may also reflect the activity of the other devices which have outputs wire-ored to those of the memory arrays and the results of the memory array test may be ambiguous.

In the preferred embodiment, a printed circuit board containing both logic elements and a memory array can be tested using the test system illustrated in FIG. 1. In FIG. 1 the main elements comprising the test system 100 are: memory test subsystem 110, logic test subsystem 120, console 123, and bed-of-nails fixture 130. The electronic assembly to be tested which has a memory array embedded in it, is for example, a printed circuit board 140, comprising memory array 150 and logic elements 160. Logic test subsystem 120 is preferably a programmable in-circuit tester which receives operator input from console 123 via bus 122 and also displays the output of the results of the test on console 123. Logic test subsystem 120 is connected to the bed-of-nails fixture 130 via bus 124. Bus 124 carries the driving signals from logic test system 120 to the bed-of-nails fixture 130 and receives the measurement signals from the bed-of-nails fixture 130 and transmits them to sensors in logic test subsystem 120. These driving signals and measurement signals are transmitted between the bed-of-nails fixture 130 and the electronic assembly under test 140 via probes (pins) 131 and 132. Logic tester 120 may be, for example, a Fairchild 303 in-circuit tester made by Fairchild Corporation of Latham, N.Y.

Memory test subsystem 110 is also preferably a programmable test system and communicates its input stimulating signal and sensing signals via bus 111 to the bed-of-nails fixture 130, which are in turn communicated between the bed-of-nails fixture 130 and the electronic assembly under test 140 via probes (pins) 131. As illustrated, probes 131 are primarily concerned with sending and receiving signals from memory array 150, whereas probes 132 are primarily concerned with the sending of signals to and the receiving of signals from logic elements 160. Memory test subsystem 110 can be, for example, a Model C-12 memory tester made by Carlton Industries of El Toro, Calif.

By combining a memory test subsystem with a logic test subsystem into one test system and using a common fixture, such as a bed-of-nails fixture, to make contact with the electronic assembly both the memory test and the logic test can be performed in a single handling of the electronic assembly thereby eliminating the need to place the electronic assembly in a memory tester to be followed or preceded by its being placed in a logic tester. This combination also provides that the memory test and the logic test can be performed in less time than the two tests being conducted separately if the system is programmed such that the logic test is exercised during portions of time when analysis of the memory test is being conducted and that the memory test is being performed during times that the results of the logic tests is being analyzed.

For example, in the preferred embodiment, the recommended test sequence is to perform the logic test on the electronic assembly first and during the overhead portion of the logic test when the logic test subsystem is compiling the test results, the memory test portion can be activated. This test sequence permits more extensive testing of the electronic assembly without incurring additional test time.

In programming the combined logic and memory test system, the test should partition the testing between the memory and the logic elements such that with the proper sequencing of the test, the total test time for a given electronic assembly will be less than if they are done by two separate test operations performed serially on two separate testers.

As illustrated in FIG. 1, logic test subsystem 120 is the master system and controls memory test subsystem 110, which is the slave system. This is a preferred configuration because logic test subsystem 120 is used to precondition the logic elements 160 and possibly a portion of memory array 150 to meet the rules stated above so that the memory array 150 can be tested. Once logic test subsystem 120 has established the memory test conditions, the logic test subsystem 120 signals memory test subsystem 110 via bus 121 so that memory test subsystem 110 can then perform the memory test on memory array 150. Upon completion of the memory test, memory test subsystem 110 can then signal logic test subsystem 120 via bus 121 that the memory test has been completed and logic test subsystem 120 can resume control of the combined test system 100. The results of the memory test can also be transmitted from the memory test subsystem 110 to logic test subsystem 120 for display on console 123 via bus 122 if desired. Alternatively, the results of the memory test may be displayed by a device connected directly to the memory test subsystem 110 (not shown in FIG. 1).

Figure 2:
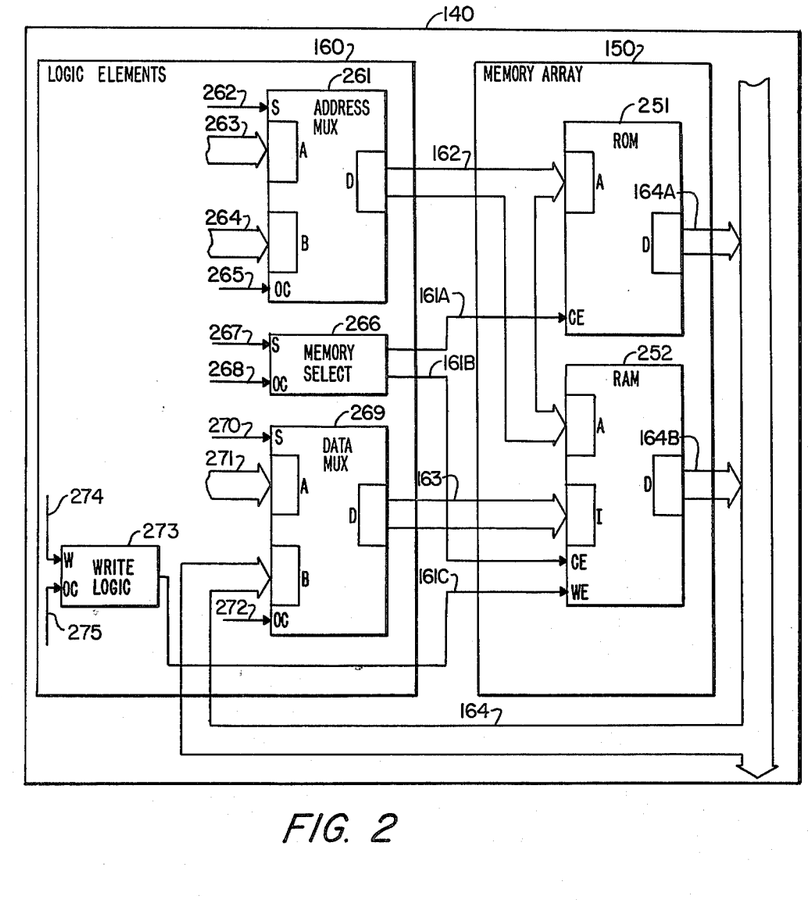
FIG. 2 is a block diagram of an example electronic assembly containing embedded memory which is to be tested by the test system of FIG. 1.

A better understanding of the operation of the test system 100 illustrated in FIG. 1 and the application of the above design rules in designing electronic assemblies which contain embedded memory can be had by applying them to an example electronic assembly to be tested illustrated in FIG. 2. In FIG. 2, the electronic assembly 140 which is to be tested is shown as containing logic elements 160 and memory array 150. In FIG. 2, memory array 150 is illustrated as being comprised of a read only memory (ROM) 251 and a read/write random access memory (RAM) 252. ROM 251 receives a plurality of address signals from address bus 162 at its address (A) inputs and produces the data read from its memory at the data (D) outputs on data bus 164A. ROM 251 reads the location specified by the address signals in response to a chip enable (CE) signal received on control line 161A. RAM 252 also receives its address (A) inputs from address bus 162 and, when reading, outputs the location read from memory at the data (D) outputs on data output bus 164B. The data output bus 164A from ROM 251 and the data output bus 164B from RAM 252 are both wired-ored together to form data bus 164. RAM 252 receives input data to be written into the RAM from data input bus 163 at its data (I) input. Data is written into RAM 252 when the RAM is enabled by a control signal on line 161B at its chip enable (CE) input and when it is also write enabled by a write signal on line 161C at its write enable (WE) input. Data is read out of RAM 252 when RAM 252 is enabled by the control signal on line 161B but not write enabled by the signal on line 161C.

Logic elements 160 comprise address multiplexer 261, memory select logic 266, data multiplexer 269, write logic 273, and other combinatorial logic elements not shown in FIG. 2. Address multiplexer 261 selects between the two sources of the address data presented on address bus 263 at the A inputs and the address signals on address bus 264 at the B inputs. The selection between the A and B inputs is made in response to a selection signal at its selection (S) input on line 262 with the selected address signals appearing at the data (D) output on address bus 162. In the example electronic assembly 140, illustrated in FIG. 2, both ROM 251 and RAM 252 are configured to both respond to the same address signals such that a means is needed to select whether the ROM memory or the RAM memory should be used at any given instance. Memory select logic 266 insures that only one of the two memories (ROM 251 or RAM 252) will respond by selectively enabling either the ROM via control line 161A or the RAM via control line 161B in response to a selection signal on line 267 at its selection (S) input. In this manner, memory select logic 266 insures that either ROM 251 will respond to the address on address bus 162 to produce data on data output bus 164A, or RAM 252 will respond to the address signals on bus 162 and produce data on output bus 164B. Thus, memory select logic 266 excludes the possibility of both ROM 251 and RAM 252 simultaneously placing data onto data bus 164. Data multiplexer 269 selects between input data on bus 271 at its A inputs, or data from the data bus 164 at its B inputs, in response to the select signal on line 271 at its select (S) input. The selected input data is available at the data (D) outputs of data multiplexer 269 on data input bus 163. Write logic 273 is used to produce the write enable signal on control line 161C which is used to enable the writing of data into RAM 252. Write logic 273 produces the write enable signal on line 161C in response to a write signal received on line 274 at its write (W) input.

Having applied the design rules stated above when designing the electronic assembly 140 (i.e., all input lines to the memory array can be made to assume a high-impedance state throughout the memory array test and having a means available to inhibit parallel operation of multiple memories whose outputs or wire-ored together) the manner in which test system 100 is used to perform a memory test will now be discussed in detail with reference to FIG. 2. As described above, memory array 150 contains two memory sub-arrays, that is, ROM 251 and RAM 252, which for purposes of this example could operate in parallel if efforts are not made to inhibit the operation of one or the other and thereby prevent the oring together of their outputs onto the data output bus 164. It being noted that both ROM 251 and RAM 256 may consist of a single integrated circuit chip producing multiple bits of data for each location addressed. Alternatively, they may consist of multiple integrated memory chips, each producing one or more bits of data for each location addressed whereby the output data bits are arranged in a word containing multiple bits of information.

When ROM 251 is to be tested by memory test subsystem 110, logic test subsystem 120 must first establish the necessary conditions such that all of the output stages of any logic element which drives the input or control signals connected to ROM 251 are placed in a high-impedance state and the operation of RAM 252 is inhibited such that the output of ROM 251 can be measured in isolation without interference from the output of RAM 252. To establish these necessary conditions, logic test subsystem 120 would place the data (D) output stage of address multiplexer 261 in the high-impedance state by applying a proper control signal at the output control (OC) input. The establishment of this high-impedance state would be done by the logic test subsystem 120 applying the necessary signal via one of its probes 132 to the output control (OC) input of address multiplexer 261 by overdriving any signal on line 265 if necessary. The establishment of the high-impedance state at the data (D) output of address multiplexer 261 will allow memory test subsystem 110 to apply whatever address is required at the address (A) inputs to ROM 251 without interference from any signal being generated by logic elements 160. Logic test subsystem 120 must also establish a high-impedance state at the outputs of memory select logic 266 such that there will be no signal on control line 161A which is connected to the chip enable (CE) input of ROM 251. This high-impedance state at the output stages of memory select logic 266 is accomplished by logic test subsystem 120 applying a proper signal to the OC input of memory select logic 266 overdriving, if necessary, any other signal on line 268 being applied from other elements within logic elements 160. It being noted that OC inputs to logic elements may not be otherwise connected to the electronic assemblies if the electronic assembly does not use the elements' tri-statable capability during the functional operation of the electronic assembly.

In addition to isolating all the inputs to ROM 251, logic test subsystem 120 must also insure that RAM 252 does not operate in parallel with ROM 251. The operation of RAM 252 can be inhibited by applying the proper signal at the chip enable (CE) input of RAM 252 by logic test subsystem 120 overdriving, if necessary, any signal which appears on control line 161B.

Having established these conditions, logic test subsystem 120 can then signal memory test subsystem 110 that it can perform the testing of ROM 251. Memory test subsystem 110 then applies the proper address and chip enable signals to ROM 251 via bus 111 and probes 131 and measures the data output which is received via probes 131 and via bus 111. The memory test subsystem 110 can then perform the memory test using the existing test programs which generate test patterns for the particular type of memory array involved. These test patterns can, when combined with parametric testing techniques, help determine whether the memory array is subject to "soft" errors. These test patterns typically involve a complete read and write (for writable memories) of each addressable location within each chip in the memory array with worst case patterns being written in the devices to determine if the device is subject to "soft" errors. These worst case memory patterns test as to whether there is any interaction between memory cells and thereby indicate whether the memory array is sensitive to any particular data pattern or addressing patterns in which the data is written into or read from the memory in a particular sequence.

An additional advantage of partitioning a testing of logic of electronic assemblies containing both logic elements and memory arrays in this fashion is that a memory tester is usually capable of testing memory arrays at speeds which cannot be accomplished by most in-circuit testers. This is particularly the case if the in-circuit tester must overdrive outputs of other logic devices in order to provide the proper stimulus at the inputs of the memory array. This in-circuit overdriving requirement usually prohibits the testing of the exact timing required to test a memory array at its rated real-time speed.

Having completed the testing of ROM 251 the memory test subsystem 110 can signal logic test subsystem 120 via bus 121 that the test is complete and that logic test subsystem 120 can then established the necessary conditions for the testing of RAM 252.

The necessary conditions for the testing of RAM 252 are similar to those recited for the testing of ROM 251, but in addition require that the output stage of data multiplexer 273 be forced to a high-impedance state such that the data inputs on bus 163 may be established by the memory test subsystem 110 without interference from signals generated by logic elements 160. In addition, the write enable input on control line 161C must be conditioned by forcing the output stage of write logic 273 into a high-impedance state by applying the proper signal to the output control (OC) input thereof, overdriving, if necessary, any signal appearing on line 275. For testing RAM 252, the output stage of memory select logic 266 which feeds chip enable control line 161B must also be placed in the high-impedance state and this is done by establishing the proper signal at the output control (OC) input thereof, overdriving, if necessary, any signal appearing on line 268 from the other elements within logic elements 160. During the testing of RAM 252, ROM 251 must be disabled such that its outputs on data output bus 164A will not interfere with those on data output bus 164B. This can be done by the logic test subsystem 120 disabling ROM 251 by placing the proper signal at the chip enable (CE) input thereof, overdriving, if necessary, any signal appearing on control line 161A.

The logic test subsystem 120, having established the proper conditions for the testing of RAM 252 by isolating the inputs thereto and inhibiting the parallel operation of ROM 251, then signals memory test subsystem 110 via bus 121. Memory test subsystem 110 can then proceed to test RAM 252 in isolation from other elements on the board by applying the proper address signals to the address (A) inputs thereof, the proper data signals to the data input (I) inputs thereof along with the necessary chip enable (CE) and write enable (WE) inputs and measure the data (D) outputs. Once memory test subsystem 110 has fully exercised RAM 252 by applying the proper input signals via bus 111 and probes 131 and measuring the response via probes 131 and bus 111, memory test subsystem 110 can signal logic test subsystem via bus 121 that the test is complete and also transfer the results of the test if it is so desired.

As can be appreciated from the above discussion, the use of the combined test system on electronic assemblies which have been designed according to the rules, which provide for memory array input and output isolation, allows for the testing of embedded memories to be performed using a relatively simple memory test. The test is simple to the extent that the test is at the same level as a memory array test that doesn't have surrounding logic or controlling logic in the same electronic assembly, so that it allows the performance of the memory test directly and it allows the test to be performed at real-time high speeds. These memory tests can be performed using the accurate timing functions and faster clock rates associated with memory test systems along with their ability to provide accurate input stimulus thus enabling the embedded memory to be tested for the detection of marginal conditions and "soft" errors. This combined test system also provides for the reduction in the number of times the electronic assembly must be handled in the testing process and thereby causing total test time compression.

Although the description of the preferred embodiment has been in terms testing integrated circuit memories mounted on printed circuit boards and the above principals are equally applicable for memory arrays embedded within an integrated circuit that also contains other combinatorial logic so long as there are means to effectuate a high-impedance state in all logic elements that provide inputs to the memory array and a means is provided from providing test input stimulus to the memory and for sensing the memory output in isolation from any other elements to which it might otherwise be wire-ored with.

Although the above discussion discussed the use of probes 131 of bed-of-nails fixture 130 for use by the memory test subsystem 110 and the use of probes 132 of bed-of-nails fixture 130 as if they were dedicated to logic test subsystem 120, it will be appreciated that in fact some or all of these probes may be used by either system and that busses 111 and 124 between the test subsystems and the bed-of-nails fixtures may in fact be a common bus such that the memory test subsystem 110 and logic test subsystem 120 can each access any probe and therefore any contact point on the electronic assembly under test that is accessible by the other test subsystem. For example, some of probes 131 may be used during the memory test by memory test subsystem 120 to establish the input conditions on address bus 162 and these same probes may be used to measure the output of address multiplexer 261 when logic elements 160 are tested by logic test subsystem 120.

Although FIG. 1 illustrates the combined test system 100 as being composed of a memory test subsystem 110 and a logic test subsystem 120 coupled by a bus 121, a closer combination of these systems may be achieved wherein a single programmable controller that controls both systems and is shared between them. In this configuration, the conducting of one test can be done as a foreground task in a real time environment and the reduction of the data gathered from the other test can be conducted as a background task in parallel with the real time generation of test stimulus and sensing of the results and by the foreground task. It will also be appreciated by those skilled in the art that memory test subsystem 110 and logic test subsystem 120 may share other elements in common with each other. It will also be appreciated however, that to the extent that memory test subsystem 110 can operate in parallel with logic test subsystem 120, the overall time it takes to test any individual electronic assembly 140 may be shortened if during the performance of the memory test, the logic test subsystem is able to process data which has been previously gathered during the testing of logic element 160 and conversely if memory test subsystem 110 can process the results of the testing of memory array 150 while logic test subsystem 120 is performing the data gathering operation on logic elements 160.

Although the preferred embodiment has been discussed in terms of combining an in-circuit test subsystem with a memory test subsystem, the use of a functional board test subsystem is also envisioned. For example, the use of a functional board tester such as the L135 functional board tester made by Teradyne Corporation of Boston, Mass., in conjunction with overdriving circuitry built into tester to board under test interface is not excluded as to its benefit in conjunction with the present invention.

While the invention has been shown and described with reference to the preferred embodiment thereof, it will be understood by those skilled in the art that the above and other changes in form and detail may be made therein without departing from the spirit and scope of the invention.

What is claimed is:

1. A test system for testing electronic assemblies having both combinatorial logic units and memory array units, said test system comprising:
   A. a memory test subsystem for applying input signals to said memory array units, for sensing outputs from said memory array units and for compiling the sensed outputs in a test routine;
   B. a logic test subsystem coupled to said memory test subsystem for applying inputs to said combinatorial logic units, for sensing outputs from said combinatorial logic units and for compiling the sensed outputs in a test routine; and
   C. a contact means coupled to said memory test subsystem and said logic test subsystem for providing electrical contact with said respective memory array units and combinatorial logic units of said electronic assemblies;
   D. said memory test subsystem and said logic test subsystem cooperating to place, under control of the logic test subsystem, all outputs of the logic units which connect to inputs or outputs of a memory array unit under test in a high-impedance state and to inhibit parallel operation of any other memory array unit, the outputs of which are wire-ored with the outputs of the memory array unit under test, such that said electronic assemblies are preconditioned so that each of said memory array units embedded therein can be tested in logical isolation and relative electrical isolation at said memory array unit's rated speed by said memory test subsystem by use of memory test routines.

2. The system of claim 1 wherein said contact means comprises a bed-of-nails fixture.

3. The system of claim 1 wherein said logic test subsystem is a programmable system.

4. A method of testing memory arrays at their rated speed in electronic assemblies having both combinatorial logic and memory arrays, said method comprising the steps of:
   performing a memory test comprising:
   A. by means of a logic test subsystem, placing in a high-impedance state the output stages of all combinatorial logic on said electronic assemblies the outputs of which connect to inputs or outputs of a target memory array to be tested;
   B. inhibiting the operation of any of said memory arrays that have outputs that are wire-ored with the outputs of said target memory array;
   C. stimulating said inputs of said target memory array by means of a memory test subsystem;
   D. measuring the response at said outputs of said memory array by means of said memory test subsystem; and
   E. returning to step A if there are other memory arrays that have not been tested; and
   by means of said logic test subsystem performing a combinatorial logic test including stimulating inputs of target combinatorial logic to be tested and measuring the response at the outputs of said target combinatorial logic, said memory test subsystem and said logic test subsystem cooperating such that one of said subsystems applies input signals and senses outputs while the other subsystem evaluates or analyzes sensed outputs from a prior test.

5. The method of claim 4 wherein said memory test subsystem and logic test subsystem are programmable subsystems.

* * * * *